US007132835B1

United States Patent
Arcus

(10) Patent No.: US 7,132,835 B1
(45) Date of Patent: Nov. 7, 2006

(54) PLL WITH BUILT-IN FILTER-CAPACITOR LEAKAGE-TESTER WITH CURRENT PUMP AND COMPARATOR

(75) Inventor: Christopher G. Arcus, San Jose, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 764 days.

(21) Appl. No.: 10/248,683

(22) Filed: Feb. 7, 2003

(51) Int. Cl.
*G01R 31/08* (2006.01)
*G01R 31/14* (2006.01)

(52) U.S. Cl. .................. 324/523; 324/548; 324/509
(58) Field of Classification Search ............ 324/523, 324/659, 678, 76.53
See application file for complete search history.

(56) References Cited

U.S. PATENT DOCUMENTS

| | | | | |
|---|---|---|---|---|
| 3,323,043 A * | 5/1967 | Hekimian | ...................... | 324/658 |
| 4,267,503 A * | 5/1981 | Westra | ...................... | 324/659 |
| 4,562,411 A * | 12/1985 | O'Rourke | ...................... | 331/1 A |
| 4,697,151 A | 9/1987 | Butler | ......................... | 320/2 |
| 5,381,085 A | 1/1995 | Fischer | ...................... | 324/76.48 |
| 5,382,923 A | 1/1995 | Shimada et al. | ................ | 331/8 |
| 5,469,393 A | 11/1995 | Thomann | ...................... | 365/201 |
| 5,561,635 A | 10/1996 | Tada et al. | ................... | 365/201 |
| 5,748,640 A | 10/1996 | Tada | ........................ | 365/201 |
| 5,677,634 A * | 10/1997 | Cooke et al. | ................ | 324/548 |
| 5,973,571 A | 10/1999 | Suzuki | ......................... | 331/17 |
| 5,982,687 A | 11/1999 | Beigel | ........................ | 365/201 |
| 5,999,467 A | 12/1999 | Bissey | ........................ | 365/201 |
| 6,011,403 A * | 1/2000 | Gillette | ....................... | 324/763 |
| 6,014,034 A | 1/2000 | Arora et al. | ................. | 324/769 |
| 6,262,634 B1 | 7/2001 | Flanagan et al. | .............. | 331/25 |
| 6,268,813 B1 | 7/2001 | de Wit | ....................... | 341/120 |
| 6,339,228 B1 | 1/2002 | Iyer et al. | ...................... | 257/48 |
| 6,396,889 B1 | 5/2002 | Sunter et al. | ................ | 375/376 |
| 6,420,880 B1 | 7/2002 | Miller | ......................... | 324/537 |
| 6,597,219 B1 * | 7/2003 | Trivedi et al. | .............. | 327/158 |
| 2005/0280406 A1 * | 12/2005 | Boerstler et al. | ......... | 324/76.53 |
| 2006/0141963 A1 * | 6/2006 | Maxim et al. | ............ | 455/192.1 |

* cited by examiner

*Primary Examiner*—Anjan Deb
(74) *Attorney, Agent, or Firm*—g Patent L.L.C.; Stuart T. Auvinen

(57) ABSTRACT

A filter capacitor within a phase-locked loop (PLL) can be tested using a built-in test circuit. The PLL's charge pump is deactivated while a test-current source is activated to supply a test current to the PLL filter capacitor. When the test current is larger than any leakage currents through the capacitor, the capacitor's voltage rises above a reference voltage. A test comparator compares the capacitor's voltage to the reference voltage and signals a good test result when the capacitor's voltage rises above the reference voltage. When leakage current is larger than the test current, the capacitor's voltage cannot rise above the reference voltage and the test comparator signal a leakage failure. The test current source can share a bias voltage with the charge pump and can drive the capacitor to a voltage higher than the charge pump does to increase leakage and stress during testing.

13 Claims, 5 Drawing Sheets

PLL WITH BUILT-IN FILTER-CAPACITOR LEAKAGE-TESTER WITH CURRENT PUMP AND COMPARATOR

BACKGROUND OF INVENTION

This invention relates to phase-locked loops (PLL's), and more particularly to built-in test circuits for PLL's.

Many of today's complex electronic systems operate synchronously and require generation of one or more clocks. Phase-locked loops (PLL's) are often employed to generate such clocks from a clock source such as a crystal oscillator. While PLL's can be sold as stand-alone integrated circuit (IC) chips, often PLLs are integrated with many other circuits on a very-large-scale-integration (VLSI) chip.

The cost of manufacturing such IC chips is related to the manufacturing yield. Yield is limited because small particles such as dust can land on the surface of the chip during processing, resulting in a point defect. Other causes of such point defects may include impurities in manufacturing chemicals and materials. The number of defects in a device is often proportional to the area of the device. For example, a large-area capacitor is more likely to have a point defect than a smaller capacitor.

FIG. 1 shows a PLL on a chip. Chip 10 may be integrated with a larger system or may be sold as a stand-alone PLL chip. Clock source 18 generates a reference clock CLK that is input to chip 10. This reference clock passes through input buffer 22 and is compared in phase to a feedback clock FB that passes through input buffer 24. Phase comparator 12 compares the phases of CLK and FB and activates charge pump 14 to charge or discharge filter capacitor 20. As capacitor 20 is charged or discharged, the voltage across capacitor 20 changes, and voltage-controlled oscillator VCO 16 senses the capacitor voltage and adjusts the output frequency of an output clock that is buffered by output buffer 26. The feedback loop may be external as shown, or an internal feedback loop may be substituted.

Typically a large capacitance is required for capacitor 20 in order to sufficiently filter time-varying phase differences. The large area required by capacitor 20 can make it particularly prone to point defects. For example, a contaminating particle in the oxide between the plates of capacitor 20 can cause leakage or even a short between the plates of the capacitor.

Chip 10 may be tested by applying inputs (stimuli) and observing outputs such as the FB output from VCO 16. When a defect such as a short occurs on capacitor 20, the voltage input to VCO 16 may be insensitive to the input from phase comparator 12, and the feedback output may not change as expected as VCO 16 may be stuck at a low frequency.

While major defects causing direct shorts on capacitor 20 may be easy to detect at the outputs of chip 10, smaller defects may be harder to detect. When a point defect is smaller and causes some leakage between the plates of capacitor 20, the voltage into VCO 16 may still vary somewhat as phase comparator 12 detects phase differences in the inputs to chip 10. When leakage is very small the current supplied by charge pump 14 may overwhelm the leakage current, making operation appear normal during testing. Small amounts of leakage can especially be masked during high-speed testing when charge pump 14 is rapidly charging and discharging capacitor 20. Such minor leakage may only be noticeable during unusual conditions such as when the feedback clock and reference clock remain in phase for long periods of time.

Thus smaller defects that cause relatively minor leakage currents from capacitor 20 may not be detected during normal testing. Failures may later occur when chip 10 is placed in a system and operating conditions are such that charge pump 14 remains off for unusually long periods of time. These sporadic failures may be extremely difficult to detect and may cause intermittent system failures resulting in hard-to-discover bugs.

What is desired is a built-in circuit for testing the PLL capacitor. A test circuit that directly tests the PLL capacitor is desired. A test circuit that can more accurately test the filter capacitor and can detect small leakage currents from the capacitor is desirable.

DETAILED DESCRIPTION

The present invention relates to an improvement in PLL test circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
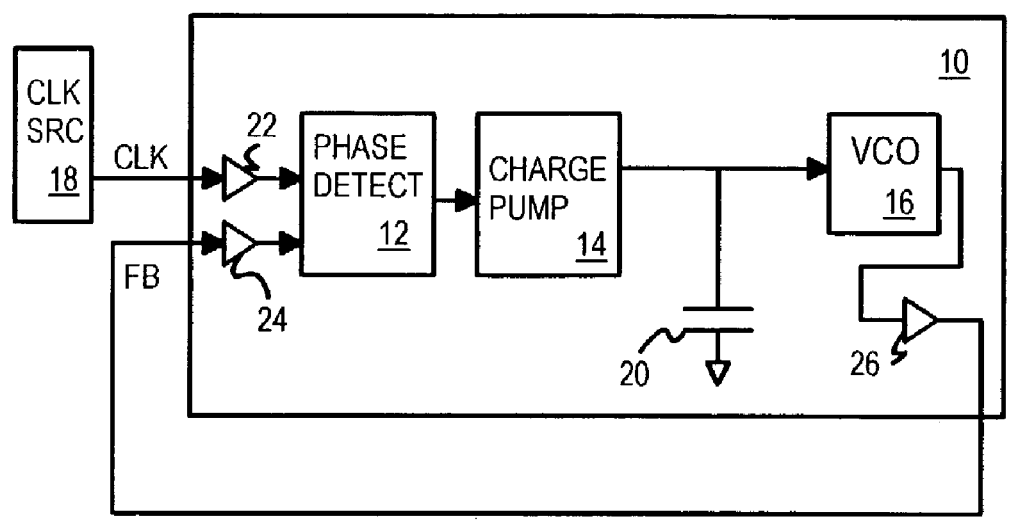
FIG. 1 shows a PLL on a chip.
Figure 2:
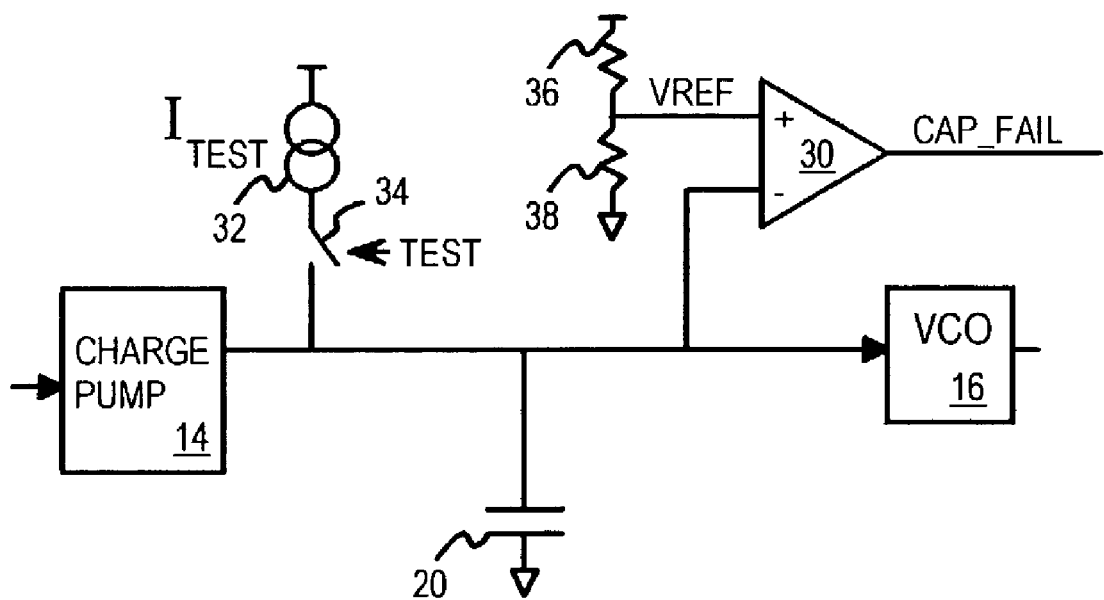
FIG. 2 is a diagram of a portion of a phase-locked loop (PLL) with a built-in test circuit for testing the filter capacitor.

FIG. 2 is a diagram of a portion of a phase-locked loop (PLL) with a built-in test circuit for testing the filter capacitor. Charge pump 14 sinks and sources current to capacitor 20 during normal operation of the PLL. As capacitor 20 is charged and discharged, the voltage across capacitor 20 changes and voltage-controlled oscillator (VCO) 16 responds to these voltage changes by adjusting its output frequency.

During production-line testing a test mode is activated. The test mode turns off charge pump 14 and possibly also VCO 16. Switch 34 closes to connect test current Itest from test source 32 to the upper plate of capacitor 20. As the test current Itest charges capacitor 20, the voltage on the upper plate rises.

Test comparator 30 receives the upper-plate voltage of capacitor 20 at its inverting input, and compares the capacitor voltage to a reference voltage VREF that is applied to the non-inverting input. The reference voltage can be externally applied during test, or it can be generated from a bias generator or from a simply voltage divider as shown. The ratio of the resistances of resistors 36, 38 set the reference voltage as a certain fraction of the power-supply voltage.

As Itest charges up capacitor 20, the capacitor's voltage rises until it rises above VREF. Then comparator 30 switches and drives its output low, since its inverting input has a higher voltage than its non-inverting input. The low output of test comparator 30. signal CAP_FAIL, indicates that capacitor 20 has successfully passed the leakage test.

When capacitor 20 has a major defect such as a short to ground, all of the test current from test current source 32 is shorted to ground through this defect. The voltage of the top plate of capacitor 20 is unable to rise above Vref due to the short. Test comparator 30 drives its output CAP_FAIL high since Vref is above the capacitor voltage.

When a minor defect occurs on capacitor 20, a leakage current can occur through this defect on capacitor 20. This leakage current may be relatively small compared to the currents supplied by charge pump 14 during normal PLL operation. However, the test current Itest supplied by test current source 32 can be a relatively small current. When the leakage current is larger than the test current Itest, the voltage on the upper plate of capacitor 20 cannot rise significantly and the capacitor voltage remains below Vref. Then test comparator 30 drives CAP_FAIL high since Vref is above the capacitor voltage.

The capacitor voltage may not be able to rise above Vref when the leakage and test currents are about the same magnitude. Thus leakage currents can be detected that are as small as the test current. The reference voltage Vref may be adjusted to higher or lower values by adjusting the ratio of resistors 36, 38 and may even be programmable to allow for more sensitive tests to be attempted.

During normal PLL operation, test switch 34 is open, disconnecting test current source 32 from capacitor 20. Test comparator 30 could also be disconnected from capacitor 20 using another switch (not shown), or it may be powered down or its output CAP_FAIL ignored by downstream logic even though test comparator 30 remains physically connected to capacitor 20.

Figure 3:
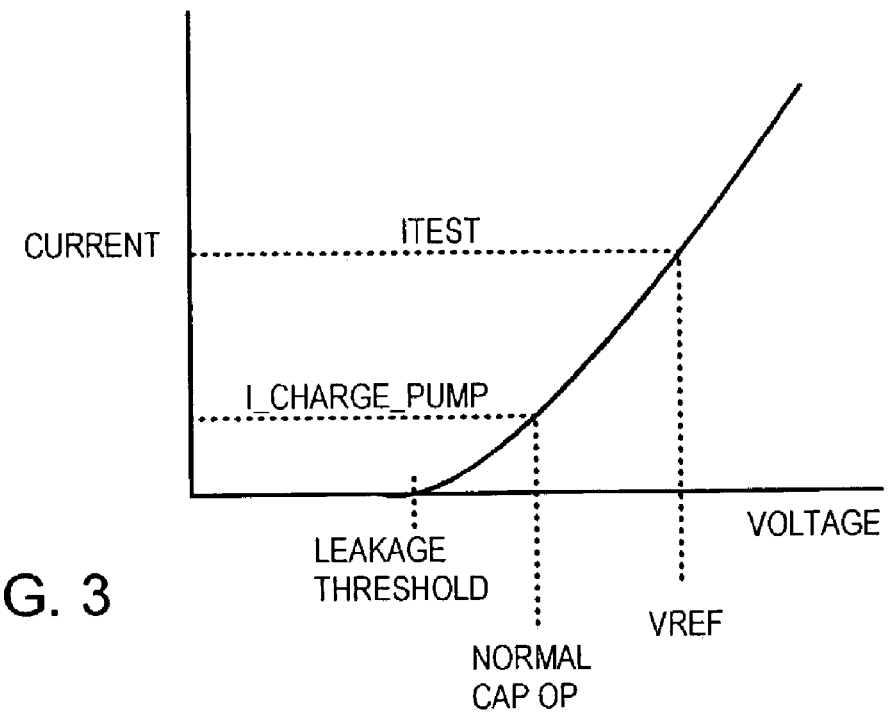
FIG. 3 is a graph of leakage current from the PLL filter capacitor.

FIG. 3 is a graph of leakage current from the PLL filter capacitor. Leakage current through a dielectric insulator such as a gate oxide or inter-metal-layer oxide often exhibits a threshold. The leakage threshold is the voltage across the capacitor's plates at which leakage current is noticeable. The leakage begins to increase above this threshold voltage. The PLL may normally drive the capacitor to voltages just slightly above this threshold, such as the "normal cap op" operating voltage caused by the charge-pump current.

The actual charge pump current is much higher than the leakage current represented by the curve, so the voltage of the capacitor is not very sensitive to the leakage current during normal PLL operation. Thus detecting the leakage current is difficult. Of course, the charge pump current is switched on and off rapidly during normal PLL operation.

The test current can be much smaller than the charge pump current. Since the test current can remain on during the test, it charges the capacitor to higher and higher voltages until the leakage current equals the test current, or until the test current source reaches its upper design limit and shuts off, such as when the capacitor voltage reaches the power-supply voltage. The current forced onto the capacitor causes the voltage to rise, which increases the leakage current as shown by the leakage-current curve. Despite the higher leakage, when the test current is higher than the leakage current at the elevated voltage, the capacitor voltage will rise above Vref. The test comparator then detects the capacitor voltage above Vref and signals that the capacitor has passed the test and is considered good.

Figure 4:
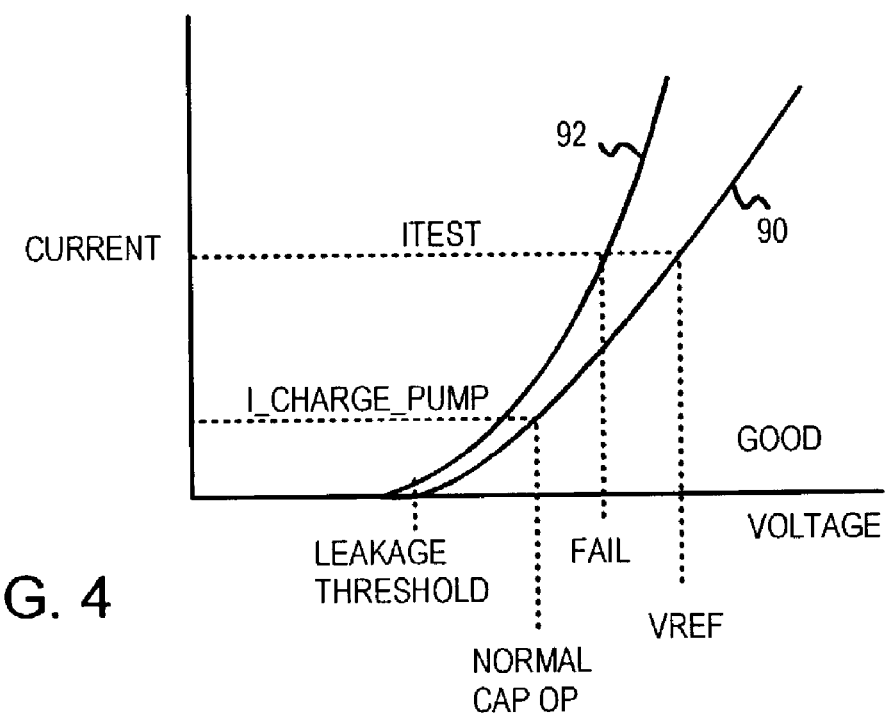
FIG. 4 is a plot of leakage curves for good and bad capacitors.

FIG. 4 is a plot of leakage curves for good and bad capacitors. The test current source can be designed to produce a current Itest that corresponds to reference voltage Vref that produces a specified leakage current. This acceptable leakage limit is represented by leakage curve 90. On curve 90, voltage Vref produces a leakage current that equals the test current Itest, so at steady-state the currents match when the capacitor voltage is Vref.

Some good chips may have even less leakage than curve 90. These good chips would have leakage curves below and to the right of curve 90, in the region labeled "good". These good chips have leakage currents at Vref which are below the test current, so their capacitor voltages are driven to greater than Vref by the test current.

When a manufacturing defect causes increased leakage from the capacitor, the leakage curve is higher than spec curve 90. Curves for bad chips are above and to the left of spec curve 90. For example, bad curve 92 has increased leakage current at all voltages above the leakage threshold. The leakage threshold itself may shift somewhat.

At the normal operating voltage, the increased leakage current of bad curve 92 is only slightly more than the allowed leakage of spec curve 90. Thus detection of leakage is difficult at the normal operating voltages. However, when the test current is applied, the capacitor voltage rises along curve 92. Once the voltage rise causes the leakage current to rise to near the test current, the voltage stops rising. At the equilibrium point on curve 92, the leakage current is the same as the test current. This equilibrium voltage "FAIL" is below the reference voltage Vref. Thus the test comparator detects that the capacitor voltage is below Vref and signals a failure.

The same test current produces different capacitor voltages on different IC parts. When the capacitor voltage is below the reference voltage chosen, the leakage is too large and the part fails. The test current forces the capacitor voltage to rise, causing an increase in leakage current through the capacitor, until the leakage current matches the test current.

Figure 5:
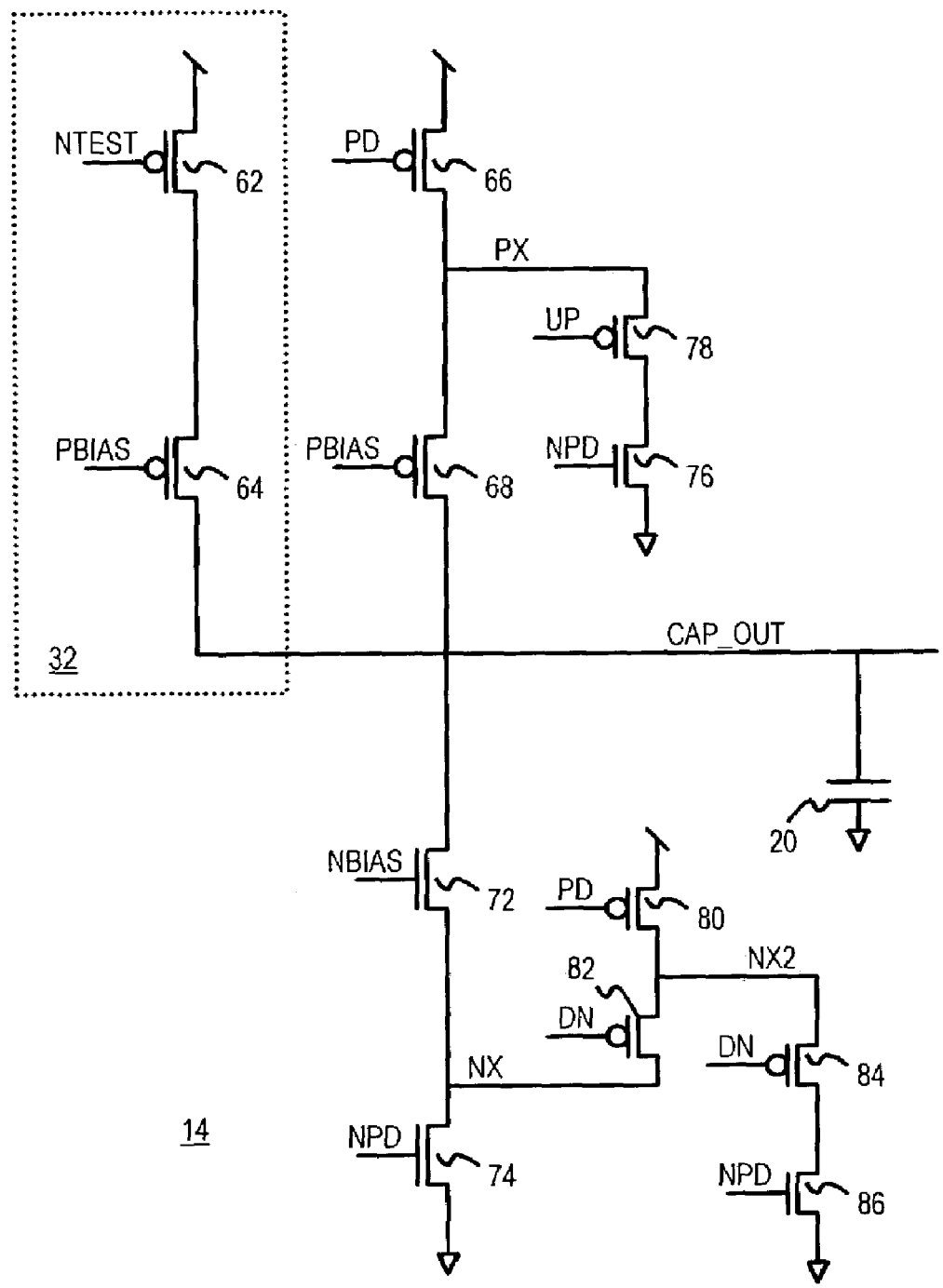
FIG. 5 is a schematic of a charge pump with a test-current source.

FIG. 5 is a schematic of a charge pump with a test current source. PLL filter capacitor 20 is charged and discharged by charge pump 14 in response to UP and DN signals from the phase detector. Test current source 32 can be closely integrated with charge pump 14, such as by using similar geometry for transistors and sharing bias voltages.

For example, a bias voltage PBIAS is generated by a bias generator such as a voltage divider or current mirror circuit. This bias voltage PBIAS is applied to the gate of p-channel bias transistor 68 in charge pump 14 and also to the gate of p-channel bias transistor 64 in test current source 32. Bias transistors serve to limit current as a function of the bias voltage PBIAS, which is an intermediate voltage such as Vcc/2 that can be adjusted for variations in supply-voltage, temperature, and process.

During capacitor test mode, test signal NTEST is driven low, causing the gate of p-channel test transistor 62 to be driven low, turning on transistor 62. As the bias voltage is applied to the gate of transistor 64 in series with transistor 62, current flows through the channels of transistors 62, 64 to the CAP_OUT node, charging capacitor 20. The voltage on CAP_OUT rises as long as the test current through transistors 62, 64 is greater than any leakage currents from capacitor 20. This voltage rise, or the absence of a voltage rise on a bad chip, can be detected by the test comparator (not shown) attached to node CAP_OUT.

Charge pump 14 can be disabled by stopping the clocks to the reference and feedback inputs to the phase detector, for some embodiments. This turns off the UP and DN signals. For other embodiments charge pump 14 can be disabled by activating disable or power-down signals to charge pump 14. For example, power-down signal PD is low and inverse power-down signal NPD is high when charge pump 14 is operating, and in the opposite states when powered down.

During power-down, the high PD causes p-channel source transistors 66, 80 to turn off, cutting current from the power supply. Also, the low NPD signal turns off n-channel sink transistors 74, 76, 86 to prevent discharging of CAP_OUT to ground during power-down mode.

During normal operation when PD is low and NPD is high, p-channel source transistors 66, 80 and n-channel sink transistors 74, 76, 86 are turned on. Bias voltages PBIAS drives the gate of p-channel bias transistor 68, and some current flows through p-channel transistors 66, 68 to CAP_OUT. When UP is low, this charging current is diverted from node PX between transistors 66, 68 by p-channel diverting transistor 78, which receives signal UP at its gate. The charging current from source transistor 66 is diverted to ground by p-channel diverting transistor 78 through n-channel sink transistor 76. The size of diverting transistor 78 can be larger than bias transistor 68 to cause most of the charging current to be diverted when UP is low. Also since PBIAS is above ground, bias transistor 68 conducts less than diverting transistor 78 which can have its gate driven fully to ground.

Capacitor 20 is discharged during normal PLL operation by current through n-channel bias transistor 72 and n-channel sink transistor 74. Discharge current is limited by bias transistor 72 since its gate voltage NBIAS is less than Vcc, such as Vcc/2.

When DN is high, p-channel diverting transistor 82 is off, allowing the full discharge current to be pulled from CAP_OUT. However, when DN goes low, p-channel diverting transistor 82 turns on, diverting the discharge current by sourcing current from p-channel source transistor 80 to n-channel sink transistor 74.

Since NBIAS is midway between power and ground, while DN is driven fully to ground, p-channel diverting transistor 82 can conduct more current than p-channel bias transistor 72 even if their sizes are the same. Thus the discharge current is diverted from node NX when DN goes low.

The amount of current diverted may be fine tuned by the addition of p-channel secondary diverting transistor 84, which also receives DN at its gate. When DN is low, some of the current sourced to node NX to divert the discharge from CAP_OUT is itself diverted from node NX2 to ground through n-channel sink transistor 86. This reduces the diversion of current.

The transistor sizes and bias voltages can be adjusted to divert the desired amount of current. Ideally, when both UP and DN are low, the net current to CAP_OUT is zero so that capacitor 20 is neither charged nor discharged. Careful layout and simulation can be used to match the currents through bias transistors 68, 72 when UP and DN are both low and currents are diverted through transistors 78, 82.

Figure 6:
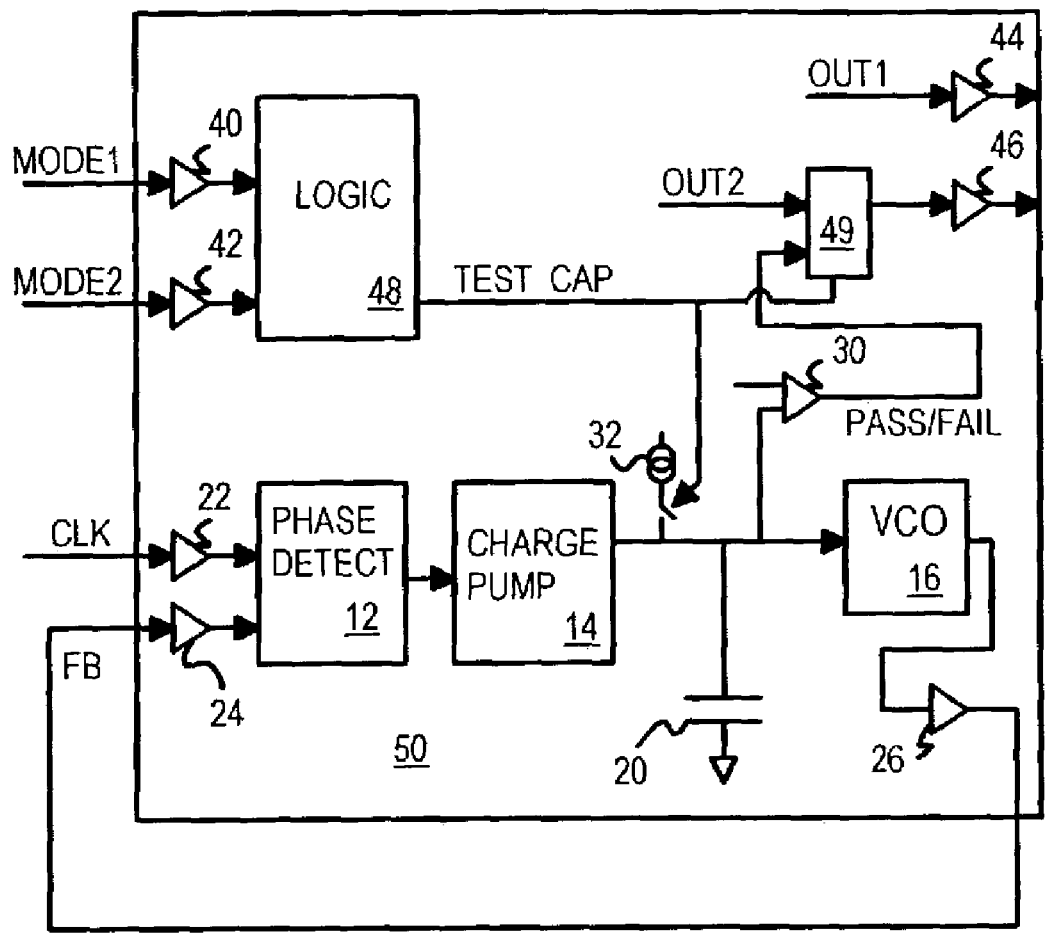
FIG. 6 is a block diagram of a PLL with capacitor-test circuitry.

FIG. 6 is a block diagram of a PLL with capacitor-test circuitry. Chip 50 includes a PLL and other circuitry. Phase comparator 12 compares the phases of clock and feedback inputs from input buffers 22, 24 and activates up and down signals to charge pump 14. Charge pump 14 then charges up or discharges down capacitor 20. The voltage on filter capacitor 20 is read by VCO 16 and sets the output frequency to output buffer 26 and the feedback clock. A feedback divider and buffering of the output of VCO 16 may be added, and an internal clock may be buffered from the output of VCO 16 for use by other circuitry in chip 50, such as a microprocessor core.

Mode signals MODE1, MODE2 are input to input buffers 40, 42 and activate logic 48 to allow chip 50 to operate in various modes. Data, address, control, or other signals may be applied to these mode inputs and other inputs.

When the mode signals are in a predetermined state, logic 48 activates the capacitor-test mode by driving signal TEST_CAP high. The mode signals may be dedicated for the purpose of activating the capacitor test mode, or more commonly an illegal combination of inputs including MODE1 and MODE2 is decoded to activate the test mode. For example, when differential signals are in the same state rather than opposite states for a period of time, this illegal condition can signal the test mode, perhaps with other control signals.

The capacitor-test signal TEST_CAP closes the test switch, allowing test current source 32 to force the test current onto capacitor 20. The capacitor voltage is sensed by test comparator 30, which drives a pass/fail signal to mux 49. Mux 49 normally selects an internal signal for output by output buffer 46, but when TEST_CAP is high, mux 49 selects the pass/fail signal from test comparator 30 for output by output buffer 46. An external tester can then read the pass/fail signal output by output buffer 46 to see if capacitor 20 has passed the leakage test. Other outputs such as output buffer 44 may also be used during the test mode.

Charge pump 14 can be disabled during the test mode by the TEST_CAP signal, or by other signals such as a power-down signal. Charge pump 14 may include a bias-voltage generator which is left on during the test mode.

ALTERNATE EMBODIMENTS

Several other embodiments are contemplated by the inventor. For example other devices such as transistors, resistors, and capacitors can be added, and parasitic devices are present on most real circuits. The filter capacitor in particular may have one or more resistors in series or in a more complex R-C filter network. The feedback clock may be divided or multiplied from the VCO output clock, and other clocks may be derived from the VCO output clock. The capacitor may actually be on one node while the test current or VCO are on nodes separated from the capacitor by resistors, yet these separate physical nodes may be considered one virtual node for analysis, purposes. Devices sizes can be adjusted after careful computer simulation or perhaps by metal or fused options.

Rather than apply the test current to the upper plate of the filter capacitor, the lower plate could receive the test current. The lower plate could be connected to a virtual ground or to another fixed voltage such as power or a bias voltage. The upper plate is usually the metal or poly upper surface of the capacitor while the lower plate is another metal plate or the substrate, but the lower and upper plates may be reversed so that the upper plate is really a lower layer on the semiconductor chip. Negative currents may flow, so the terms source and sink can be considered interchangeable.

Polarities can be reversed, such as by reversing inputs to test comparator 30 to output CAP_GOOD rather than a failure signal. The filter capacitor can have its bottom plate on other voltages than ground, such as Vcc or a bias voltage such as Vcc/2, Vcc/4, etc. Additional inverters and buffers can be added. Leakage from other components on the capacitor's upper-plate node can also be detected. Since other devices such as input transistors in the VCO are typically much smaller than the filter capacitor, leakage is most often caused by capacitor defects.

The test current source can deliver a higher charge than the charge pump does, allowing the capacitor to be charged to a higher voltage than normal. The higher voltage produces a higher leakage current which is easier to detect. This added stress adds a guardband to the capacitor testing. The test current source can deliver a higher charge than the charge pump either by being on for a longer period of time or by delivering more current (charge per time) such as by using larger-size transistors for the test current source.

The capacitor test may be activated in a variety of ways, such as otherwise unused or illegal combinations of inputs, programmable bits or registers, or power-up sequences. The test may be a built-in-self-test (BIST) that is automatically activated at power-up or reset of a larger system, or it may be manually activated or programmably activated either during production testing or within a larger system, perhaps even by an end-user or software such as an operating system. The test result from the test comparator may be muxed to an output either by traditional multiplexers or by a bus attached to several drivers. The test result may also be latched into a programmable register and read by software or the production tester using a sequence to read the programmable registers.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A testable phase-locked loop (PLL) comprising:
a reference-clock input for receiving a reference clock from an external clock source;
a feedback clock;
a phase detector that receives the reference clock and the feedback clock;
a filter capacitor on a filter node;
a charge pump, responsive to a phase difference detected by the phase detector, for charging and discharging the filter capacitor on the filter node;
wherein the charge pump comprises:
a first source transistor having a gate receiving a mode signal that indicates when the PLL is operating;
a first bias transistor having a gate receiving a bias voltage;
wherein the first source transistor and the first bias transistor are in series between a power supply and the filter node;
a second source transistor having a gate receiving a mode signal that indicates when the PLL is operating;
a second bias transistor having a gate receiving a second bias voltage;
wherein the second source transistor and the second bias transistor are in series between a ground and the filter node;
a voltage-controlled oscillator (VCO) having the filter node as an input and outputting a clock having a frequency that depends on a filter voltage of the filter node;
wherein the feedback clock is output by the VCO or is derived from the clock output by the VCO;
a test current generator, activated during a leakage test mode, for driving a test current onto the filter node; and
a test comparator, receiving a reference voltage and coupled to the filter node, for comparing the filter voltage to the reference voltage to determine when the test current is able to charge the filter capacitor and to determine when the test current is unable to charge the filter capacitor beyond the reference voltage;
wherein the test comparator outputs a result signal that indicates a leaky filter capacitor when the filter voltage cannot reach the reference voltage,
whereby the filter capacitor within the testable PLL is tested for leakage by the test current generator and the test comparator.

2. The testable phase-locked loop of claim 1 wherein the test current charges the filter node to a stress voltage above a normal operating voltage that the charge pump charges the filter node to during normal PLL operation;
whereby the filter capacitor is stressed to an elevated voltage during leakage testing.

3. The testable phase-locked loop of claim 1 wherein the reference voltage is a voltage between the power supply voltage and the ground.

4. The testable phase-locked loop of claim 1 wherein the bias voltage is intermediate between a power-supply voltage and the ground;
wherein the test current generator receives the bias voltage and generates the test current as a function of the bias voltage;
wherein the charge pump receives the bias voltage and generates a charging current to the filter capacitor as a function of the bias voltage,
whereby the bias voltage is shared by the charge pump and the test current generator.

5. The testable phase-locked loop of claim 4 wherein the bias voltage is about half of the power-supply voltage.

6. The testable phase-locked loop of claim 4 wherein the bias voltage is adjusted for supply-voltage, temperature, and process variations.

7. The testable phase-locked loop of claim 1 wherein the test current generator comprises:

a test source transistor having a gate receiving a test signal that indicates when the filter capacitor is being tested for leakage;

a test bias transistor having a gate receiving a bias voltage;

wherein the test source transistor and the test bias transistor are in series and connected to the filter node.

8. The testable phase-locked loop of claim 7 wherein the test source transistor and the test bias transistor are p-channel transistors connected in series between the power supply and the filter node.

9. The testable phase-locked loop of claim 8 wherein the charge pump further comprises:

a first diverting transistor, coupled to divert current from a node between the first source transistor and the first bias transistor, having a gate receiving a control signal from the charge pump that indicates when to charge the filter capacitor;

a second diverting transistor, coupled to divert current from a node between the second source transistor and the second bias transistor, having a gate receiving a control signal from the charge pump that indicates when to discharge the filter capacitor.

10. The testable phase-locked loop of claim 9 wherein the first source transistor and the first bias transistor are p-channel transistors;

wherein the second source transistor and the second bias transistor are p-channel transistors.

11. The testable phase-locked loop of claim 10 wherein the first and second diverting transistor are p-channel transistors.

12. A method for testing a capacitor in a phase-locked loop (PLL) comprising:

receiving a reference clock and a feedback clock;

detecting a phase difference between the reference clock and the feedback clock using a phase detector of the PLL;

storing charge on the capacitor and outputting a filter voltage of the capacitor;

charging and discharging the capacitor in response to the phase detector during normal PLL operation;

applying the filter voltage as an input to a voltage-controlled oscillator (VCO) and generating the feedback clock in response to the filter voltage from the capacitor;

activating a test charger during a leakage test mode, and charging the capacitor using the test charger during the leakage test mode;

disabling the test charger during normal PLL operation;

determining when the capacitor was successfully charged by the test charger and determining when the test charger was unable to successfully charge the capacitor during the leakage test mode; and outputting to an external tester a pass/fail signal that indicates a failure when the test charger was unable to successfully charge the capacitor during the leakage test mode, whereby leakage of the capacitor is tested and the external tester is signaled when the test charger is unable to successfully charge the capacitor.

13. The method for testing a capacitor in a phase-locked loop (PLL) of claim 12 further comprising:

comparing the filter voltage to a reference voltage during the leakage test mode;

charging the capacitor to a filter voltage above the reference voltage during the leakage test mode when no leakage occurs on the capacitor means, but charging the capacitor to a filter voltage below the reference voltage when leakage occurs from the capacitor.

* * * * *